United States Patent
Mackh et al.

(10) Patent No.: US 12,424,495 B2
(45) Date of Patent: Sep. 23, 2025

(54) CHIP SEPARATION SUPPORTED BY BACK SIDE TRENCH AND ADHESIVE THEREIN

(71) Applicant: Infineon Technologies AG, Neubiberg (DE)

(72) Inventors: Gunther Mackh, Neumarkt (DE); Martin Brandl, Brennburg (DE)

(73) Assignee: Infineon Technologies AG, Neubiberg (DE)

( * ) Notice: Subject to any disclaimer, the term of this patent is extended or adjusted under 35 U.S.C. 154(b) by 633 days.

(21) Appl. No.: 17/701,771

(22) Filed: Mar. 23, 2022

(65) Prior Publication Data

US 2022/0328355 A1 Oct. 13, 2022

(30) Foreign Application Priority Data

Apr. 12, 2021 (DE) ...................... 10 2021 109 003.2

(51) Int. Cl.
*H01L 21/78* (2006.01)
*H01L 21/683* (2006.01)
*H01L 21/687* (2006.01)

(52) U.S. Cl.
CPC .......... *H01L 21/78* (2013.01); *H01L 21/6836* (2013.01); *H01L 21/68742* (2013.01)

(58) Field of Classification Search
CPC ........... H01L 21/6836; H01L 21/78–86; H01L 2221/68327–68336; H01L 21/67132; H01L 21/6835; H01L 21/6838; H01L 21/6831; H01L 21/6833; H01L 21/683; H01L 21/687; H01L 21/68707; H01L 21/68714; H01L 21/68792; H01L 21/68785; H01L 21/68778;

(Continued)

(56) References Cited

U.S. PATENT DOCUMENTS 5,541,140 A 7/1996 Goebel et al.
6,368,932 B1 4/2002 Goebel et al.
(Continued)

FOREIGN PATENT DOCUMENTS

| DE | 4320780 | 3/1995 |
|----|---------|--------|
| DE | 10 2016 118 477 | 3/2018 |
| EP | 1050076 | 11/2000 |

OTHER PUBLICATIONS

Charavel, Remy, et al. "Tuning of Etching Rate by Implantation: Silicon, Polysilicon and Oxide", American Institute of Physics, Nov. 2006.

*Primary Examiner* — Eric A. Ward
(74) *Attorney, Agent, or Firm* — Dicke, Billig & Czaja, PLLC (57) ABSTRACT

A method of separating an electronic chip from a wafer is disclosed. In one aspect, the method comprises forming at least one trench in a back side of the wafer around at least part of the electronic chip to be separated, forming a back side metallization covering at least part of the back side and at least part of the at least one trench and attaching an adhesive layer of a tape to at least part of the back side metallization. The electronic chip is separated by removing material from a front side of the wafer along a separation path which includes part of the at least one trench in such a way that, during separating, the adhesive layer fills at least part of the at least one trench above a level of the back side metallization on the back side.

17 Claims, 5 Drawing Sheets

(58) Field of Classification Search
CPC ......... H01L 21/68771; H01L 21/68764; H01L 21/68757; H01L 21/6875; H01L 21/68742; H01L 21/68735; H01L 21/68728; H01L 21/68721; H01L 2221/68322; H01L 2221/68304; H01L 2221/68309; H01L 2221/68313; H01L 2221/68318; H01L 2221/68331; H01L 2221/6834; H01L 2221/68345; H01L 2221/6835; H01L 2221/68354; H01L 2221/68359; H01L 2221/68363; H01L 2221/68368; H01L 2221/68372; H01L 2221/68377; H01L 2221/68381; H01L 2221/68386; H01L 2221/6839; H01L 2221/68395; H01L 2221/683
See application file for complete search history.

(56) References Cited

U.S. PATENT DOCUMENTS

| | | | |
|---|---|---|---|
| 6,720,667 B2* | 4/2004 | Kim | H01L 21/823493 |
| | | | 438/689 |
| 8,673,700 B2 | 3/2014 | Yedinak et al. | |
| 2005/0006725 A1* | 1/2005 | Kurosawa | H01L 21/78 |
| | | | 257/618 |
| 2005/0009299 A1* | 1/2005 | Wada | H01L 21/304 |
| | | | 438/459 |
| 2006/0054273 A1* | 3/2006 | Nagasaka | H01L 21/78 |
| | | | 156/247 |
| 2006/0223234 A1* | 10/2006 | Terayama | H01L 21/6836 |
| | | | 438/460 |
| 2008/0277765 A1* | 11/2008 | Lane | H01L 21/78 |
| | | | 257/E21.546 |
| 2011/0006404 A1* | 1/2011 | Lee | H01L 23/3114 |
| | | | 257/E23.179 |
| 2011/0062564 A1 | 3/2011 | Gruenhagen et al. | |
| 2011/0277813 A1 | 11/2011 | Rogers et al. | |
| 2012/0313224 A1 | 12/2012 | Fukuda et al. | |
| 2013/0189830 A1* | 7/2013 | Hirschler | H01L 21/31138 |
| | | | 438/464 |
| 2015/0249133 A1 | 9/2015 | Yanase et al. | |
| 2016/0042997 A1* | 2/2016 | Takahashi | H01L 21/6836 |
| | | | 438/464 |
| 2017/0148697 A1* | 5/2017 | Kamphuis | H01L 21/78 |
| 2018/0166328 A1* | 6/2018 | Tang | H01L 21/76802 |
| 2022/0013401 A1* | 1/2022 | Wirz | H01L 21/4814 |

* cited by examiner

CHIP SEPARATION SUPPORTED BY BACK SIDE TRENCH AND ADHESIVE THEREIN

CROSS-REFERENCE TO RELATED APPLICATION

This Utility patent application claims priority to German Patent Application No. 10 2021 109 003.2, filed Apr. 12, 2021, which is incorporated herein by reference.

BACKGROUND

Field of the Invention

The present invention relates to a method of separating an electronic chip from a wafer, and to an electronic chip.

Description of the Related Art

Packages may be denoted as encapsulated electronic chips with electrical connects extending out of the encapsulant and being mounted to an electronic periphery, for instance on a printed circuit board. Before packaging, a semiconductor wafer is singularized into a plurality of electronic chips. After singularizing the wafer into the singularized electronic chips, the electronic chips of the wafer may be subsequently picked for further processing.

Singularization may be accomplished by cutting the wafer from a front side thereof. In particular in the presence of a back side metallization, subsequent pick-up of the singularized electronic chips may require an undesirably high pick-up force. This may render in particular very thin electronic chips prone to damage and may extend the pick-up time necessary for sequentially picking up electronic chips from a separated wafer in an undesirable way. Furthermore, the pickup capability is conventionally a limiting factor concerning a minimum thickness and/or maximum size of electronic chips to be handled.

SUMMARY

There may be a need to handle electronic chips of a wafer with reasonably small pick-up forces.

According to an exemplary embodiment, a method of separating an electronic chip from a wafer is provided. The method comprises forming at least one trench in a back side of the wafer around at least part of the electronic chip to be separated, forming a back side metallization covering at least part of the back side and at least part of the at least one trench, attaching an adhesive layer of a tape to at least part of the back side metallization, and separating the electronic chip by removing material from a front side of the wafer along a separation path which includes part of the at least one trench in such a way that, during separating, the adhesive layer fills at least part of the at least one trench above a level of the back side metallization on the back side.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings.

DETAILED DESCRIPTION

According to an exemplary embodiment, a method of separating an electronic chip from a wafer is provided. The method comprises forming at least one trench in a back side of the wafer around at least part of the electronic chip to be separated, forming a back side metallization covering at least part of the back side and at least part of the at least one trench, attaching an adhesive layer of a tape to at least part of the back side metallization, and separating the electronic chip by removing material from a front side of the wafer along a separation path which includes part of the at least one trench in such a way that, during separating, the adhesive layer fills at least part of the at least one trench above a level of the back side metallization on the back side.

According to another exemplary embodiment, an electronic chip is provided which comprises a semiconductor body, an active region at a front side of the semiconductor body, a back side metallization at a back side of the semiconductor body, a circumferential notch at a circumferential corner of the semiconductor body between the back side and sidewalls of the semiconductor body, and a dopant selectively in a region of the semiconductor body next to the circumferential notch.

According to an exemplary embodiment, electronic chips may be separated from a wafer in a way that small pick-up forces following singularization can be achieved. This may be accomplished by trenching the wafer from its back side prior to singularization which can be carried out, in turn, after forming a back side metallization. Preferably but not necessarily, trench formation may be accomplished by selectively doping later trench regions of the wafer, followed by an etching of the doped regions with a higher etching rate as compared to an etching rate of non-doped regions. Still before singularization, an adhesive layer of a temporary or dicing tape may be attached to the trenched back side metallization on the trenched wafer. With this approach, subsequent singularization from the opposing front side, for instance using a dicing blade or by laser ablation, may result in an upwardly bent configuration of edges of the structured back side metallization of the obtained electronic chips thanks to the previous trench formation. This may suppress the formation of downwardly protruding burrs (in particular when singularizing using a dicing blade) or recast (in particular when singularizing by laser ablation) close to a separation path (such as a cutting line), and may avoid an undesired pick-up force increasing crawling effect between the burrs or recast and the tape. The mentioned crawling effect can be so strong that it determines the necessary pickup force, so that the crawling effect may be a limiting factor what concerns making electronic chips thinner and thinner. Advantageously, the adhesive layer of the tape may fill at least part of the trench to a degree extending beyond a level of the back side metallization in the trench region. Preferably, at least part of the trench is filled above a baseline level—which may be defined as a horizontal level corresponding to an interface between back side metallization and wafer outside of the trench(es)—with adhesive of the adhesive layer of the tape during formation of the separation path. As a result, the glue supports the back side metallization against cracks and breakage. Consequently, defect-free separated electronic chips can be picked-up from the sticky tape with a reasonably small pick-up force for subsequent processing, for instance in terms of assembly. Descriptively speaking, the trench-based upward bending of the back side metallization adjacent to the separation path as well as the ensured mechanical integrity of the back side metallization and the wafer material close to the separation path promote an easy lifting of intact individual electronic chips from the adhesive layer of the tape. Exemplary embodiments may reliably protect in particular very thin electronic chips from damage and may significantly shorten the pick-up time of sequentially picking up electronic chips from a separated wafer. With the manufacturing architecture according to exemplary embodiments, the pickup capability may be increased what concerns a minimum thickness and/or maximum size of electronic chips to be handled.

As a fingerprint of the described manufacturing architecture involving trench formation, an electronic chip according to an exemplary embodiment may have a circumferential notch at the back side extending along a circumferential corner of the electronic chip. Furthermore, dopant residues may be present in semiconductor material adjacent to the circumferential notch. A correspondingly configured electronic chip may be picked up with a small pick-up force and is properly protected from undesired damage during manufacturing, even when being extremely thin.

In the following, further exemplary embodiments of the method and of the electronic chip will be explained.

In the context of the present application, the term "wafer" may particularly denote a semiconductor substrate which has been processed to form a plurality of integrated circuit elements in an active region of the wafer and which may be singularized into a plurality of separate electronic chips. For example, a wafer may have a disk shape and may comprise a matrix-like arrangement of electronic chips in rows and columns. It is possible that a wafer has a circular geometry or a polygonal geometry (such as a rectangular geometry or a triangular geometry).

In the context of the present application, the term "electronic chip" may particularly denote a naked die, i.e. a non-packaged (for instance non-molded) chip made of a processed semiconductor, for instance a singulated piece of a semiconductor wafer. A semiconductor chip may however also be an already packaged (for instance molded or laminated) die. One or more integrated circuit elements (such as a MEMS, a diode, a transistor, etc.) may be formed within the semiconductor chip. Such a semiconductor chip may be equipped with a metallization on a front side (corresponding to an active region) and/or on a back side, in particular with one or more pads.

In the context of the present application, the term "separating" may particularly denote the procedure of singularizing a plurality of separate electronic chips from an integral wafer as sections of the previous wafer. Such a separation or singularization may be accomplished in particular by sawing, or by laser cutting.

In the context of the present application, the term "trench" may particularly denote a notch, an elongate recess or an indentation formed in a body, in particular a semiconductor body, of the wafer. For instance, the trench or notch may be circumferentially closed around or along a perimeter of an electronic chip to be separated from the wafer. For example, the trench may have a rectangular shape in a circumferential direction. In an extension direction into the semiconductor body of the wafer, a cross-section of the trench may preferably have a concave rounded shape.

In the context of the present application, the term "front side" may particularly denote a main surface of a wafer or an electronic chip in and/or on which at least one integrated circuit element (such as a transistor or a diode) may be monolithically integrated. Hence, a front side may correspond to a main surface of the wafer or electronic chip with an active area.

In the context of the present application, the term "back side" may particularly denote a main surface of a wafer or an electronic chip opposing or facing away from a front side thereof. For example, the back side of a wafer or an electronic chip may be free of monolithically integrated circuit elements.

In the context of the present application, the term "separation path" may particularly denote a trajectory along which material of the wafer is removed for separating the individual electronic chips from the wafer compound. For instance, a separation path may be a cutting path along which a cutting blade or knife (or alternatively a laser beam) moves and removes material of the wafer during chip separation.

In the context of the present application, the term "active region" may particularly denote a surface region of a semiconductor body of a wafer or an electronic chip, in and/or on which surface region at least one monolithically integrated circuit element is formed. In particular, such an active region may form a surface region of a wafer or an electronic chip at a front side thereof.

In the context of the present application, the term "circumferential notch at a circumferential corner" may particularly denote an indentation or a depression extending into semiconductor material of an electronic chip, and extending along a closed perimeter. More specifically, the notch may extend into a corner of a for instance substantially cuboid electronic chip between bottom main surface and sidewalls to thereby form a stepped geometry with two exterior corners and one interior corner in between. Each of said beforementioned corners may be defined by a sharp edge or by a rounded edge. It is also possible that the circumferential notch is at least partially lined with a bent portion of a back side metallization.

In the context of the present application, the term "dopant" may particularly denote a trace of an impurity element that is introduced into a semiconductor body of a wafer or an electronic chip and which locally alters the properties of the semiconductor body, and particular its properties in terms of etchability. When implanted into crystalline substances (in particular a semiconductor such as silicon or germanium), the dopant atoms get incorporated into the crystal lattice. However, the dopant may also be introduced into a non-crystalline or poly-crystalline substance. When the semiconductor body is a group IV material (such as silicon), the dopant atoms may be in particular of a group III material (such as boron) or a group V material (such as antimony). It is also possible that the dopant atoms comprise both a group 111 material and a group V material. In yet another embodiment, the dopant atoms may form a counter-doping (i.e. may be of inverse dopant type) as compared to the semiconductor substrate.

In an embodiment, the method comprises forming two spaced trenches in the back side of the wafer around at least part of the electronic chip. Highly advantageously, a sub-portion of each of the two trenches may form part of the separation path. More specifically, separation of electronic chips from the wafer compound may be accomplished by cutting through semiconductor material between the trenches and partially including the trenches. As a result, a slanted or stepped geometry of wafer and/or back side metallization material may be achieved directly adjacent to a separation path, which may promote an easy and low-force pick-up of the separated electronic chips.

In particular when a separation path for separating an electronic chip includes parts of two trenches, said trenches may be shared between different electronic chips to be separated from the wafer. For instance, the electronic chips may be arranged in a matrix like manner in rows and columns in the disk-shaped wafer. Singularizing multiple electronic components may then comprise cutting along rows and columns by removing base material between trenches and corresponding to part of the trenches. For instance, different trenches may be arranged straight along rows and columns of the wafer for separating electronic chips in between.

In an embodiment, the method comprises forming the two spaced trenches parallel to each other and/or around a common center. For instance, said two trenches may both be circumferentially closed, the smaller trench extending within the limits of the larger trench. In other words, the smaller trench may be a closed loop trench extending entirely within another closed loop trench constituting the larger trench. This may allow a cutting blade or a laser beam to cut along a separation path extending through the entire wafer and extending along a space between the two trenches.

In an embodiment, the method comprises separating the electronic chip along the separation path which includes a region between the two spaced trenches. By removing material between the spaced trenches, a shape of a lateral edge of the separated electronic chips may be partially defined by the trench geometry. Consequently, the geometry at the lateral edge may be at least partially defined by the trench geometry.

In an embodiment, the method comprises forming the at least one trench circumferentially closed along the entire electronic chip to be separated. Hence, the separated electronic chip may be adapted for being liftable by a small pick-up force along its entire circumference, since the pick-up force reducing impact of the trench may be effective around the entire perimeter. Alternatively, the at least one trench may extend only along a part of a circumference of the trench, so that a low pick-up force is promoted along a portion of a perimeter of the electronic chip, while the separation process can be carried out in a particularly quick way.

In an embodiment, the method comprises forming the at least one trench with a depth being smaller than or equal to a thickness of the adhesive layer. When ensuring that the depth of the trench(es) does not exceed the thickness of the glue layer, it can be promoted that the glue layer fills the trench(es) to a significant degree, in particular completely. In other words, trenches with such a sufficiently small depth can be (at least almost) entirely filled by tape glue to fully support all areas during dicing.

In an embodiment, the method comprises forming the at least one trench with a depth of not more than 10 μm, in particular in a range from 3 μm to 10 μm. A dimension of 10 μm may be an appropriate thickness of the adhesive layer of the tape which reliably adheres the wafer and the electronic chips, while allowing a sufficiently small pick-up force. Trenches with a depth in the range from 3 μm to 10 μm can be properly filled with adhesive material of the directly adjacent adhesive layer while being manufacturable in a quick way and in a fashion, which promotes a low force pick-up. Furthermore, a trench depth of not more than 10 μm is properly compatible also with a separation of ultrathin electronic chips having a thickness of 60 μm and less, for which a limitation of the pick-up force is of utmost advantage in view of their limited mechanical robustness.

In an embodiment, the method comprises forming the at least one trench with a width smaller than a width of the separation path. In particular, the at least one trench may be formed with a width of not more than 70%, or even of not more than 50%, of the width of the separation path. Along the separation path (along which a sawing process may proceed), a sufficient support shall remain and a volume of the trenches should not be of excessive size.

In an embodiment, the method comprises separating the electronic chip by one of the group consisting of cutting with a mechanical blade, and laser processing. Mechanically cutting a wafer into individual electronic chips may create undesired burrs of a back side metallization close to a cutting line. Correspondingly, cutting a wafer into individual electronic chips by laser processing may create undesired recast of the back side metallization close to the cutting line. What concerns blade-related mechanical cutting, metallic material may be deformed or bent downwardly during separation. In terms of laser cutting, material of a back side metallization may be melted or rearranged in another way so as to form a downwardly extending recast. Such a burr or recast may result in a clawing between the back side metallization and the tape and may thereby increase the pick-up force in an undesired way. However, the formation of trenches at lateral ends of a separation path along which wafer material is removed during singularization may strongly suppress this undesired clawing phenomenon.

In an embodiment, the method comprises separating by guiding the mechanical blade through the entire wafer, through the entire adhesive layer, and (preferably only partially) into a foil of the tape below the adhesive layer. By advancing a mechanical dicing blade beyond the wafer through the entire adhesive layer and up to a foil of the tape, a complete singularization can be ensured and artefacts of the electronic chips adjacent to the separation path may be prevented to thereby strongly reduce the pick-up force.

In an embodiment, the method comprises separating the electronic chip in such a way that the adhesive layer fills the entire trench or trenches during separating. By ensuring that an entire trench is filled with glue during singularization the entire back side metallization as well as material of the semiconductor body can be reliably protected against breakage and formation of burrs or recast. Thereby, a strong reduction of the pick-up force of the singularized electronic chips may be accomplished by efficiently reducing a burr-to-glue sticking effect.

In an embodiment, the method comprises forming the at least one trench by covering the back side of the wafer with a patterned mask, by doping the wafer through the patterned mask, and by etching the wafer after removing the patterned mask. According to such a preferred embodiment, selective doping of trench-defining portions on the back side of a semiconductor body of the wafer using a structured mask (for instance a photolithographically processed mask) may allow to precisely define doped surface regions of the semiconductor body. After removing the mask, wet etching (for instance using HNA, i.e. an etching solution composed of hydrofluoric acid, nitric acid and acetic acid) results in trench formation due to a more efficient etching of doped semiconductor material as compared to non-doped semiconductor material. Preferably, an etching medium may be used that reacts in an etch amplifying way to doping differences. For instance, HNA (here, a proportion of acetic acid causes the reinforcing effect depending on the doping concentration) may be used for this purpose. The described process allows formation of trenches with high precision and very low effort.

In another embodiment, the method comprises forming the at least one trench by covering the back side of the wafer with a patterned mask, and by etching the wafer through the patterned mask. Also this approach allows formation of trenches, wherein a doping process can be omitted. However, the overall effort of the above described dopant-based trench formation may be even lower.

In an embodiment, the method comprises picking the separated electronic chip from the tape after the separating. When a wafer is separated into a plurality of electronic chips, the plurality of separated electronic chips may be picked up sequentially from the sticky tape. This shows that the pick-up process has a high contribution of the overall effort in terms of time consumption. By reducing the pick-up time, exemplary embodiments may significantly reduce the overall effort of the singularization and pick-up process.

In an embodiment, picking the separated electronic chip comprises lifting the electronic chip from the tape by at least one pin applying a lifting force to the back side of the electronic chip. Such pins or needles may penetrate the tape including its adhesive layer and may thereby apply a lifting force being oriented upwardly. In particular in the presence of very thin electronic chips having a thickness of not more than 60 μm, lifting the electronic chips may also result in bending or even oscillating of such chips which may render the pick-up process delicate and time-consuming. Advantageously, a reduction of the pick-up force by the trench-based singularization concept of exemplary embodiments may reduce or even eliminate such conventional shortcomings.

In an embodiment, picking the separated electronic chip comprises sucking the lifted electronic chip at the front side of the electronic chip (in particular during or after lifting of the electronic chip by the above-mentioned at least one pin). During and/or after lifting of a separated electronic chip from the back side by the above described one or more pins, the lifted electronic chip may be taken away from the rest of the wafer by a nozzle or the like which applies a vacuum suction force to the respective electronic chip at its front side. By such a vacuum nozzle, the electronic chip may be handled or transported to a destination, such as an assembly position.

In an embodiment, the electronic chip has a thickness of less than 100 μm, in particular of less than 60 μm. Modern chip technologies, for instance in terms of power semiconductor applications, reduce chip thickness more and more. While this has significant advantages in terms of packaging, compactness and performance, extremely thick electronic chips are a challenge in terms of handling. This applies in particular to the task of picking up such an extremely thin electronic chip. However, with the described concept of trench formation on the back side followed by separation from the front side, the picking force can be significantly reduced and even very thin electronic chips may be handled without the risk of damage and in a time efficient way.

In an embodiment, the electronic chip is configured for experiencing a vertical current flow between the front side and the back side during operation. In particular, electric current may flow between a pad on a lower main surface of the electronic component through semiconductor material of the electronic component to another pad at an upper main surface of the electronic component. For instance, the electronic chip experiencing a vertical current flow may be configured as a field effect transistor chip in which a source pad and a gate pad are arranged on one main surface and a drain pad is arranged on the opposing other main surface of the electronic chip.

Electronic chips having a vertical current flow during operation may require both a front side metallization and a back side metallization. Equipping a wafer with the back side metallization may however involve challenges in terms of formation of burrs or recast during singularization. As described above, exemplary embodiments may however cope with such challenges by triggering an upward bending of a chip edge at its bottom side thanks to a singularization along one or two trenches on which a back side metallization is formed.

However, other exemplary embodiments may also be applied to electronic chips without vertical current flow. For this kind of electronic chips, a back side metallization may be formed for example to comply with requirements of a die attach adhesive, for cooling purposes, etc.

In an embodiment, the circumferential notch is rounded at the back side. This rounding is the fingerprint of an etching process by which a trench with round surface profile is formed.

In an embodiment, the circumferential notch is delimited by a continuously curved (for instance substantially S-shaped) surface portion of the semiconductor body. Also this geometry results from a formation of the trenches by etching.

In an embodiment, a concentration of the dopant is at least $10^{17}$ atoms per cm$^3$, in particular at least $10^{18}$ atoms per cm$^3$. In particular, the concentration of the dopant may be at least 10 times, in particular at least 100 times, preferably at least 1000 times of an intrinsic carrier concentration in a semiconductor body. Correspondingly, a concentration along at least part of a circumference of the notch at the back side of the semiconductor body is larger than (in particular at least 10 times of, more particularly at least 100 times of, preferably at least 1000 times of) a concentration in a central portion at the back side of the semiconductor body. The larger the difference between the dopant concentration of the locally confined dopant implantation for trench formation purposes on the one hand and of an intrinsic unspecific carrier concentration in the semiconductor body, the higher is the precision of the formation of the trenches in terms of dimensions, position and shape. In case of a counter-doping of the dopant atoms as compared to a semiconductor substrate (i.e. counter-doping with dopant atoms of inverse dopant type compared with the semiconductor substrate), other (in particular smaller) concentrations of the dopant than the mentioned ones may be appropriate.

In an embodiment, the electronic chip is a power semiconductor chip. Such a power semiconductor chip may have integrated therein one or multiple integrated circuit elements such as transistors (for instance field effect transistors like metal oxide semiconductor field effect transistors and/or bipolar transistors such as insulated gate bipolar transistors) and/or diodes. Exemplary applications which can be provided by such integrated circuit elements are switching purposes. For example, such another integrated circuit element of a power semiconductor device may be integrated in a half-bridge or a full bridge. Exemplary applications are automotive applications.

The one or more electronic chips (in particular semiconductor chips) may comprise at least one of the group consisting of a diode, and a transistor, more particularly an insulated gate bipolar transistor. For instance, the one or more electronic chips may be used as semiconductor chips for power applications for instance in the automotive field. In an embodiment, at least one semiconductor chip may comprise a logic IC or a semiconductor chip for RF power applications. In one embodiment, the semiconductor chip(s) may be used as one or more sensors or actuators in microelectromechanical systems (MEMS), for example as pressure sensors or acceleration sensors, as a microphone, as a loudspeaker, etc.

As substrate or wafer for the semiconductor chips, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

Thin power devices may have a back side metal which leads on the wafer back side to burr during mechanical dicing or to recast during ablation laser dicing. The burr or recast significantly determines the adhesion to the tape and the necessary pick-up force.

It may be desirable to reduce or even eliminate such a burr or recast phenomenon on the die adhesion.

According to an exemplary embodiment, pick-up forces required for picking up a separated electronic chip from a wafer on an adhesive tape can be significantly reduced by forming trenches under a back side metallization of the wafer prior to a singularization from a front side along a separation path which encompasses, at an edge thereof, part of the trench or preferably parts of two opposing trenches. This may allow to pick-up even very thin dies with a low-force, simple and fast pick-up process. Exemplary embodiments may be applied particularly advantageously for handling electronic chips of power devices with low on-state resistance (RDSON) value. Moreover, such an approach may result in a faster pick-up process. This is highly beneficial, because pick-up of electronic chips from a singularized wafer is a serial process and therefore has a significant impact on the overall effort in terms of chip handling. Apart from this, exemplary embodiments may allow to obtain less die cracks during pick-up.

According to a preferred embodiment, formation of the one or more trenches may be carried out as follows: Firstly, a modification of wafer back side stress release may be accomplished by local doping at a semiconductor body of the wafer at one or more positions at which subsequently formation of trenches and thereafter singularization shall be carried out. Advantageously, the pick-up behavior may be promoted by local wafer back side doping. More specifically, an exemplary embodiment may apply a patterned implant on the wafer back side in such a way that a following wet etch process relieves stress and results in shallow grooves on the wafer back side. Advantageously, pick-up forces may be reduced by reducing a sticking effect of burr to glue and tape. More specifically, burrs or recast of back side metallization may be suppressed by forming trenches in the semiconductor body under the back side metallization and by partially of preferably entirely filling said trenches with adhesive material of an adhesive layer of a temporary tape attached to the back side metallization prior to singularization. Descriptively speaking, this may reduce an undesired crawling effect of burrs or recast of the back side metallization with the adhesive tape. Advantageously, edge adhesion of the separated electronic component or chip may be suppressed by a slight upward bending of the back side metallization adjacent to the trench(es).

In a preferred embodiment, each electronic chip to be separated may be surrounded by two trenches, each trench corresponding to a respective edge of a dicing blade or a cutting laser beam. Advantageously, each trench width may be smaller than a width of a kerf or separation path. In embodiments, the trench depth may be not more than 10 µm, since the trench is preferably completely filled by tape glue which may have a typical thickness of about 10 µm. At the same time, the trench depth should be preferably at least 1 µm to achieve a sufficiently strong impact in terms of upward bending of a free edge of a back side metallization for reducing a pick-up force. By following the aforementioned design rules, it may be possible to fully support all areas during dicing. It may be advantageous to not exceed a trench depth of 10 µm when the electronic chips are embodied as ultrathin dies having a thickness below 60 µm where pick-up becomes most critical.

In terms of trench formation, it may be possible to execute an implant based patterning using an etch solution which is sensitive to dopant concentration and where the etch rate increases with increasing implant dose. Both the same dopant type as in the base material is possible (both n-type or both p-type), as well as an opposite dopant type (one n-type and the other one p-type).

Alternatively, it may also be possible to form trenches by a selective etching process which has a higher etching rate in non-doped semiconductor material as compared to doped semiconductor material. The logic of trench formation may then be inverse in comparison with the aforementioned embodiment.

In embodiments, a process of wafer back side stress release by local doping may be carried out, which comprises grinding of the wafer back side. Thereafter, a back side lithography can be executed. This may be followed by a back side implant process of doping surface portions of the wafer (for instance doping by boron or arsenic). Subsequently, a resist may be removed by stripping. Thereafter, shallow dimples or trenches may be created at implanted areas due to a locally higher etch rate. Next, a back side metal deposition may be carried out (for instance gold-tin, or silver-based). Subsequently, a tape having an adhesive layer may be mounted on the back side metallization, so that the adhesive preferably fully embeds the dimples or trenches. A glass carrier, which may have previously carried the wafer on the front side, may then be removed. Thereafter, the wafer may be diced (for example mechanically or by laser processing). After that, the separated electronic chip or die may be lifted from the tape at the back side using one or more ejection pins or needles. Thereby, the electronic chip may be fully released from the tape.

According to an exemplary embodiment, a process flow for wafer back side metal deposition may be configured in such a way that the pick-up forces needed for pick are reduced as compared to conventional approaches. Burrs which may be created during mechanical dicing, or recast formed during ablating laser dicing may significantly determine the adhesion of the electronic chips to the tape and hence the necessary pick-up forces. However, a reduction of pick-up forces may be highly desirable because this can enable pick-up of even thinner dies with simple pick-up processes. Consequently, a low-force pick-up process may be in particular favorable for reducing the RDSON value of power devices. A faster pick-up process enabled by exemplary embodiments may be a benefit because pick-up is a serial process and therefore a significant contributor to the efforts during singularization and handling of chips. Furthermore, a reduced pick-up force may reduce the risk of die cracks during pick-up. These advantages may be obtained by formation of trenches of a semiconductor body below a back side metallization and adjacent to a separation path between adjacent electronic chips.

In particular, such trenches may be created by a patterned implant process on the wafer back side in such a way that a following wet etch stress relief results in shallow grooves on the wafer back side selectively in dopant implantation regions. These grooves can be preferably located in the vicinity of dicing channels. Different embodiments can include different dopants (in particular of group III or V materials, for instance boron or arsenic). In different embodiments, different layouts of the grooved dimples, different dicing methods, etc. may be implemented.

Exemplary embodiments may reduce the risk of forming cracks during pick-up and/or may enable pick-up of thinner dies (in particular with improved performance) and/or a faster pick-up process. At chip back side corners or at chip back side edges, regions of increased doping level may be created.

The present inventors have surprisingly found that a lateral chip edge provides a significant contribution to an adhesive force to be exceeded by a pick-up force for lifting and picking up a separated electronic chip from a tape or dicing foil. Investigations have shown that this holds in particular for very thin electronic chips having a thickness of less than 100 μm, and in particular below 60 μm. With such ultrathin electronic chips, pick-up is a particular challenge, since pick-up forces may also apply mechanical stress to the electronic chip which may be thereby prone to damage during the pick-up process. This challenge may be rendered even more critical due to the fact that a chip edge is prone to the formation of burrs (in case of mechanical dicing) or recast (in case of laser dicing) which may increase the adhesion force of the electronic chip on an adhesive tape and consequently the required pick-up force due to a mechanical interlocking or crawling effect between tape and back side metallization. Highly advantageously, an exemplary embodiment may reduce chip adhesion in particular at a chip edge, thereby enabling pick-up of even very thin electronic chips with moderate pick-up forces. This may be achieved by creating one or more trenches on the back side of the wafer having a depth of preferably not more than the thickness of an adhesive layer of a tape at which the wafer is adhered. It has been surprisingly found that the trench position(s) should be (preferably fully) supported mechanically during singularization, since the effect of excessive adhesion on the chip edge may be otherwise even enhanced. Advantageously, such a support of trench positions may be obtained by filling the trenches with adhesive material of the tape either completely or at least up to a vertical level above the base level of the upper side of the back side metallization. This supports the back side metallization during singularization and ensures that the free ends of the back side metallization of the separated electronic chip protrude upwardly rather than downwardly at the critical chip edges.

FIG. 1 to FIG. 5 show different structures obtained during carrying out a method of separating and picking an electronic chip 100 from a wafer 102 according to an exemplary embodiment.

Figure 1:
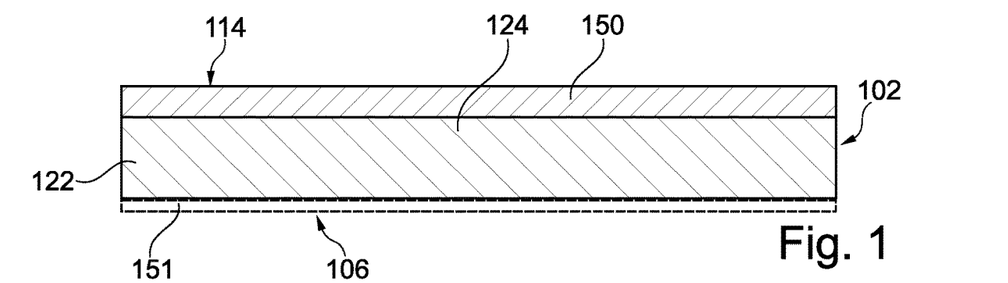
FIG. 1 to FIG. 5 show different structures obtained during carrying out a method of separating and picking an electronic chip from a wafer according to an exemplary embodiment.

Referring to FIG. 1, a cross-sectional view of a bulk substrate in form of a semiconductor body 122, for instance a silicon body, of a silicon wafer 102 is shown. A carrier 150, which is here embodied as a glass carrier, is arranged on a front side 114 of the wafer 102. In a surface portion of the wafer 102 on the front side 114, an active area 124 is formed in which one or more integrated circuit elements may be monolithically integrated.

According to FIG. 1 and as indicated schematically by reference sign 151, the wafer 102 is thinned from a back side 106, for instance by grinding. By said grinding process, the thickness of the wafer 102 may be reduced for example to 50 μm to 60 μm. Thereafter, a further thinning process may be carried out on the back side 106, for instance by removing further 20 μm of the wafer 102 by wet etching.

Figure 2:
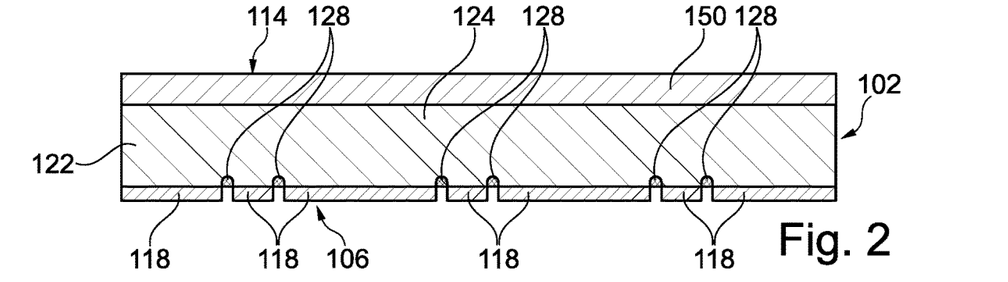

As shown in FIG. 2, the back side 106 of the wafer 102 may be covered with a layer of photoresist. Thereafter, the layer of photoresist may be patterned to thereby form a patterned mask 118. By patterning, specific surface portions of the back side 106 of the wafer 102 may be exposed, whereas the rest of the surface on the back side 106 of the wafer 102 remains covered with photoresist material of the patterned mask 118. Thereafter, the exposed surface portions of the wafer 102 on the back side 106 may be doped through the patterned mask 118, so that defined and locally confined regions of dopant 128 may be formed in a surface portion of the wafer 102 on the back side 106.

Hence, a lithographic treatment of the back side 106 may be followed by a dopant implant (for instance a dopant 128 embodied as boron, arsenic or antimony) at the back side 106. Thereafter, the patterned mask 118 may be removed, for instance by resist stripping. Descriptively speaking, the implant profile in accordance with the patterned mask 118 defines the shape of later formed dimples or trenches 104 at the defined positions of dopant 128. For example, use of a quad mode implant process may allow to form a shallow smooth trench profile. Traces of the implant or dopant 128 remain in the processed wafer 102 and in a readily manufactured electronic chip 100.

Although not shown in FIG. 2, the process may continue with a further etching of the wafer 102 from its back side 106 after having removed the patterned mask 118. Thereby, trenches 104, 130 (see FIG. 3) may be formed in the back side 106 of the wafer 102 at the positions of the dopant 128. For this purpose, a selective wet etching process may be carried out which has a higher etching rate in doped semiconductor material of the wafer 102 (i.e. in regions of the dopant 128) as compared to non-doped semiconductor material of the wafer 102. Although not shown in the cross-sectional view of FIG. 2, the trenches 104, 130 may form circumferentially closed recesses in the bottom surface or back side 106 of the wafer 102 and may surround a respective part of the wafer 102 which corresponds to an electronic chip 100 to be separated from the wafer compound. Advantageously and still referring to FIG. 2 and additionally to FIG. 3, the method may comprise forming two spaced trenches 104, 130 in the back side 106 of the wafer 102 around one electronic chip 100 to be singularized. For instance, each of the trenches 104, 130 on the back side 106 of the wafer 102 may be a closed (for example rectangular) recess, wherein smaller diameter trench 104 may be arranged completely inside the limits of larger diameter trench 130. Hence, each of trenches 104, 130 may be formed circumferentially closed around the entire electronic chip 100 to be separated. More specifically, the two spaced trenches 104, 130 may be composed of a plurality of connected trench sections, each corresponding pair of trench sections of trenches 104, 130 extending parallel to each other. Furthermore, both trenches 104, 130 may be formed around a common center 153.

Trenches 104, 130, . . . may also extend as straight intersecting lines extending along rows and columns between different electronic chips 100 of the wafer 102 to be separated. Separation of the electronic chips 100 may then be carried out by cutting along trenches 104, 130, . . . along two perpendicular directions.

In an alternative embodiment (not shown), the trenches 104, 140 may be formed without formation of dopant 128 in exposed surface portions of the wafer 102 on the back side 106, and a selective etching of semiconductor material of the wafer 102 through the openings of the patterned mask 118 may be carried out for trench formation before removing the patterned mask 118. However, the previously described embodiment involving the formation of regions of dopant 128 may involve less overall effort due to a faster etching process for defining trenches 104, 130.

Figure 3:
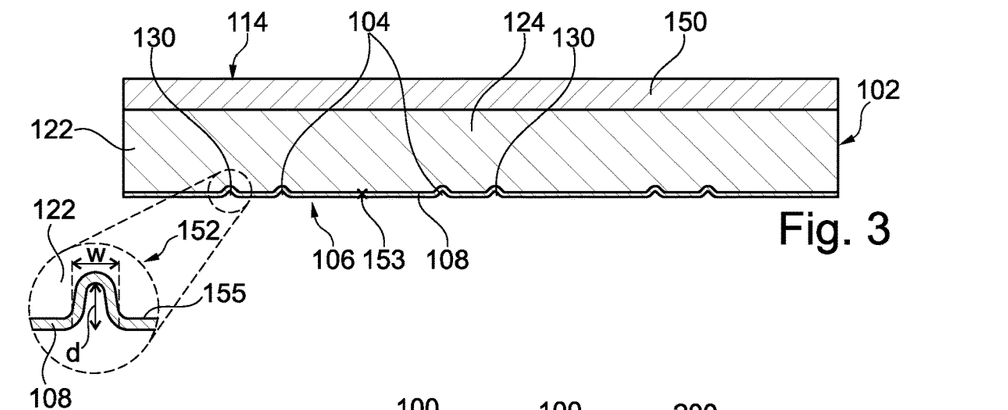

In order to obtain the structure shown in FIG. 3, the exposed back side 106 may be subjected to the above described etching process, such as a wet etch process, for the purpose of stress relief and for forming the trenches 104, 130 at the positions of the dopant 128. By this etching process, further semiconductor material may be removed from the back side 106 of the wafer 102. During said etching process, the trenches 104, 130 in form of shallow dimples are created at the implanted areas of dopant 128 only, due to the higher etch rate of doped semiconductor material as compared to non-doped semiconductor material of wafer 102. For instance, etching of non-doped semiconductor material may remove 5 µm from wafer 102, while the same etching process of doped semiconductor material in regions of the dopant 128 may remove 10 µm from wafer 102.

Thereafter, a back side metallization 108 (for instance made of AuSn) is formed on the entire back side 106 and also in surface portions of the trenches 104, 130. For example, a thickness of the back side metallization 108 may be in a range from 1 µm to 5 µm. The back side metallization 108 may provide a reliable electric contact and may contribute to an efficient heat removal. The back side metallization 108 may be formed as a conformal layer of substantially homogeneous thickness. Thus, the back side metallization 108 may cover the entire back side 106 and the trenches 104, 130.

As can be taken from a detail 152 in FIG. 3, each trench 104, 130 may be formed with a depth "d" of for example 5 µm. Furthermore, the depth "d" may be smaller than or equal to a thickness "D" of an adhesive layer 110 of a tape 112 which is subsequently attached to a bottom side of the structure according to FIG. 3, see FIG. 4. A width "w" of each trench 104, 130 may be smaller than a width "W" of a separation path 116, i.e. than the width of a cutting line by which the wafer 102 is singularized into multiple electronic chips 100 according to FIG. 4. For instance, width "w" of each trench 104, 130 may be 10 µm.

Figure 4:
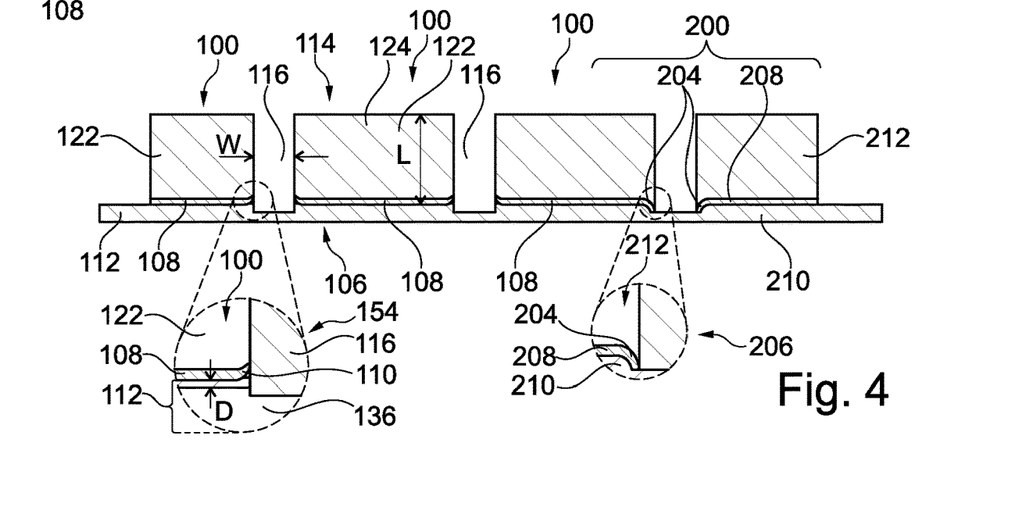

In order to obtain the structure shown in FIG. 4, tape 112 is mounted in an adhesive way on the back side metallization 108 on the back side 106. Thereafter, the carrier 150 is removed from the front side 114, and the wafer 102 is separated by dicing (for instance mechanically or using a laser) along a separation path 116 into individual electronic chips 100.

As can be taken from a detail 154 in FIG. 4, adhesive layer 110 of tape 112 may be attached to the back side metallization 108. More specifically, tape 112 may be composed of a foil 136 (for instance a plastic foil) and the adhesive layer 110 applied to a top side of the foil 136 facing the wafer 102. The adhesive layer 110 may advantageously extend into the trenches 104, 130 during separation of electronic chips 100, as described in further detail below referring to FIG. 9.

After attaching tape 110 to the back side 106 and exposing the front side 114 by removing optional carrier 150, electronic chips 100 are separated from the wafer 102 by removing material from the front side 114 of the wafer 102 along a vertical and circumferentially closed separation path 116. In a vertical direction, the separation path 116 extends entirely through the wafer 102 and also includes part of the trenches 104, 130. The relation between the trenches 104, 130 in the wafer 102, the back side metallization 108 on the wafer 102, the adhesive layer 110 of the tape 112 and the separation path 116 may be adjusted in such a way that, during separating, the adhesive layer 110 fills the trenches 104, 130 preferably completely. Advantageously, the adhesive layer 110 should fill the trenches 104, 130 at least partially above an upper baseline level 155 of the back side metallization 108 on the back side 106 during separation (as described below in further detail referring to FIG. 9 and FIG. 10). With such a configuration, the adhesive layer 110 supports the back side metallization 108 against cracks during the separation process. Furthermore, the upwardly bent portion of the back side metallization 108 in an interface region between a bottom side and a sidewall of the separated electronic chip 100, being a consequence of the trenches 104, 130, reduces a pick-up force required for picking up the electronic chip 100 from the tape 112. Thus, a pick-up of the electronic chip 100 from the tape 112 may be accomplished without the risk of damaging the tiny electronic chip 100 during handling.

In order to fully separate each electronic chip 100 from the wafer compound, the separation path 116 furthermore extends circumferentially around the sidewalls of the separated electronic chip 100. Moreover, separation of a respective electronic chip 100 occurs along a separation path 116 which includes a region between the two spaced trenches 104, 130. In particular, material of the wafer 102 of the back side metallization 108 and part of the tape 112 is removed between the trenches 104, 130 including material above a respective sub-portion of each trench 104, 130.

Each electronic chip 100 separated according to FIG. 4 may have a very small thickness "L" of for example 40 µm. The processes of separating (as already described) and picking up (as described in the following) can be carried out even with electronic chips 100 having such a small thickness. An electronic chip 100 with such a small thickness "L" can also be configured for experiencing a vertical current flow between the front side 114 and the back side 106 during operation of the electronic chip 100. For instance, electronic chip 100 may be a power semiconductor chip with a monolithically integrated field effect transistor.

Preferably, the back side 106 of the wafer 102 covered with the back side metallization 108 is fully supported via dicing tape glue of the adhesive layer 110 during the dicing process to avoid back side chipping and to avoid residues of dicing mud between the back side 106 of the electronic chip 100 and the tape 112. A glue layer thickness "D" may be for example around 10 μm to perfectly match with the described boundary conditions. This glue or adhesive layer 110 should preferably fill the dimples or trenches 104, 130 during separation, partially or entirely. Preferably, the trench height or depth "d" does not exceed the glue layer thickness "D" to promote a pronounced filling of the trenches 104, 130 with adhesive during separation.

Moreover, the use of two small trenches 104, 130 (located at dicing channel edges, i.e. at the left-hand side end and at the right-hand side end of the separation path 116) may be easier to fill by surrounding tape glue of adhesive layer 110 than a very wide and very deep back side trench across the whole dicing street or separation path 116.

Figure 5:
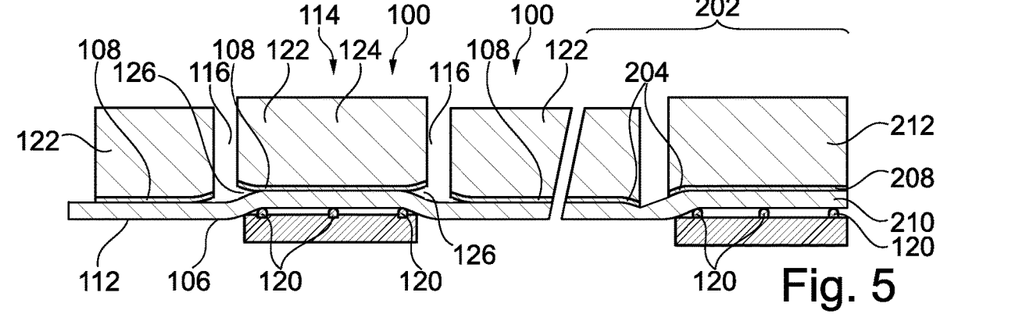

FIG. 5 shows how a separated electronic chip 100 is picked up from the tape 112 after the separating process according to FIG. 4. During picking the separated electronic chip 100, the electronic chip 100 is lifted from the tape 112 by ejection pins 120 or needles applying a vertical lifting force to the back side 106 of the electronic chip 100. Due to this lifting force, the electronic chip 100 is moved upwardly and is detached from the tape 112. Advantageously, the upwardly curved or slanted edge portions of the back side metallisation 108 of the singularized electronic chip 100, which may also result in the formation of a circumferential notch 126, promotes a low-force detachment of the electronic chip 100 from the tape 112. Formation of undesired burrs at the lateral ends of the back side metallization 108 (which may conventionally interlock with material of the tape 112 to thereby increase the pick-up force) may be reliably prevented due to the described manufacturing process involving the trenches 104, 130 and their filling with adhesive during separation. The reduced pick-up force may also reliably protect the tiny electronic chip 100 against mechanical damage during pick-up and handling.

Although not shown in the figures, the pick-up process may be supported also from a top side by sucking the lifted electronic chip 100 at the front side 114 of the electronic chip 100 using a vacuum suction nozzle (not shown). While being held by the vacuum suction nozzle, the separated electronic chip 100 may be transported elsewhere, for instance for assembly purposes.

Summarizing, the process illustrated according to FIG. 5 comprises lifting of die-type electronic chip 100 from the bottom side with ejection pins 120, release of edge clamping thanks to the formation of trenches 104, 130 making use of an extra implant in form of dopant 128, and a full release of the electronic chip 100 from the tape 112. By the described advantageous measures, a release of the edges of the tiny electronic chip 100 from tape 112 becomes possible.

A region 200 in FIG. 4 and a region 202 in FIG. 5 show for comparison purposes a scenario in which no trenches 104, 130 are formed prior to separation of an electronic component, and in which no extra implant is carried out.

Also referring to a detail 206 in FIG. 4, a downwardly extending burr 204 of a back side metallization 208 on an electronic chip 212 shows a strong mechanical interlocking or clawing with a tape 210 and thereby results in an undesirably high pick-up force. The electronic chip 212 is prone to cracking due to the excessive force acting on the tiny electronic chip 212 during pick-up.

FIG. 6 to FIG. 11 show different structures obtained during carrying out a method of separating and picking an electronic chip 100 from a wafer 102 according to an exemplary embodiment and in other approaches described for comparative purposes. In each of FIG. 6 to FIG. 11, a manufacturing architecture according to an exemplary embodiment is shown on the left hand side. This manufacturing process is similar as described above referring to FIG. 1 to FIG. 4. With reference sign 220, a scenario without trench formation in a wafer 214 is shown for comparison purposes.

Figure 6:
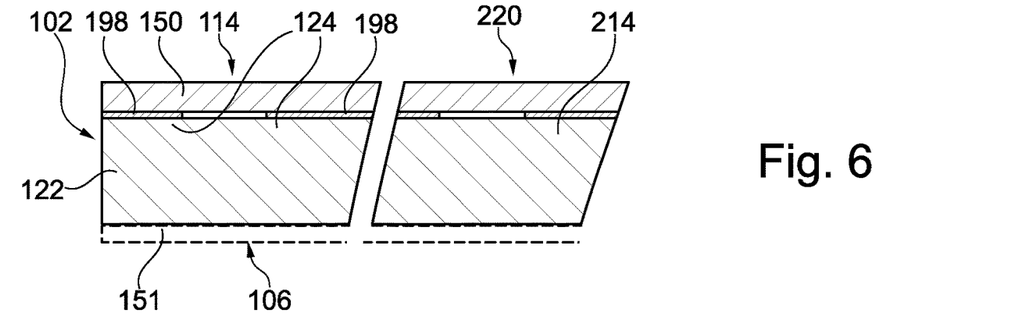
FIG. 6 to FIG. 11 show different structures obtained during carrying out a method of separating and picking an electronic chip from a wafer according to an exemplary embodiment and in another approach described for comparative purposes.

FIG. 6 illustrates a thinning of a wafer back side similar as in FIG. 1. As shown in FIG. 6, wafer 102 is provided with a front side metallization 198 on front side 114.

Figure 7:
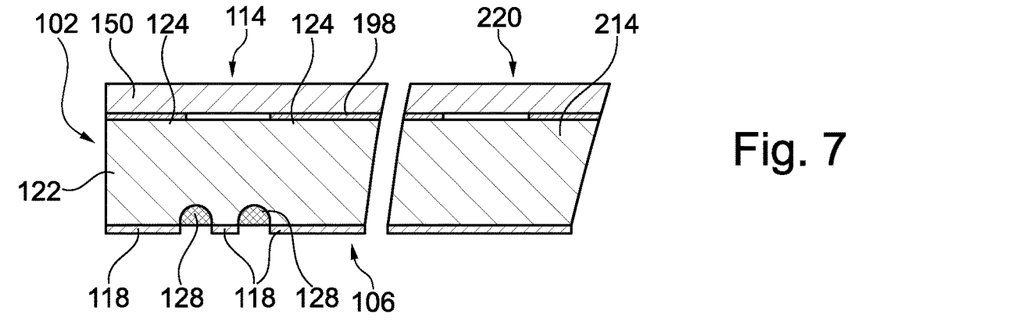

Referring to FIG. 7, a resist layer is attached to the back side 106 and is patterned to form a patterned mask 118 on the left-hand side. Still referring to the left-hand side of FIG. 7, dopant 128 is implanted in exposed surface portions of the wafer 102 in which the patterned mask 118 is absent. Thereafter, the photoresist forming the patterned mask 118 is removed. Hence, a process comprising back side lithography, back side implant (for instance using boron dopant), and resist strip can be carried out.

Figure 8:
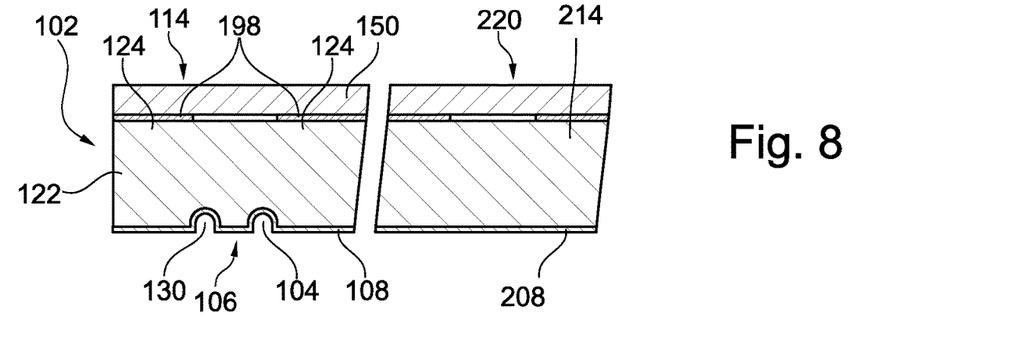

In order to obtain the structure shown on the left hand side of FIG. 8, a stress release wet etch process is carried out on the back side 106 while simultaneously forming shallow dimples or trenches 104, 130 selectively at implanted areas due to a higher etch rate in the regions corresponding to the dopant 128 as compared to non-doped semiconductor material of wafer 102. Thereafter, back side metallization 108 is formed by metal deposition (for example made of AuSn).

On the right hand side shown with reference sign 220, a conformal back side metallization 208 is formed.

Figure 9:
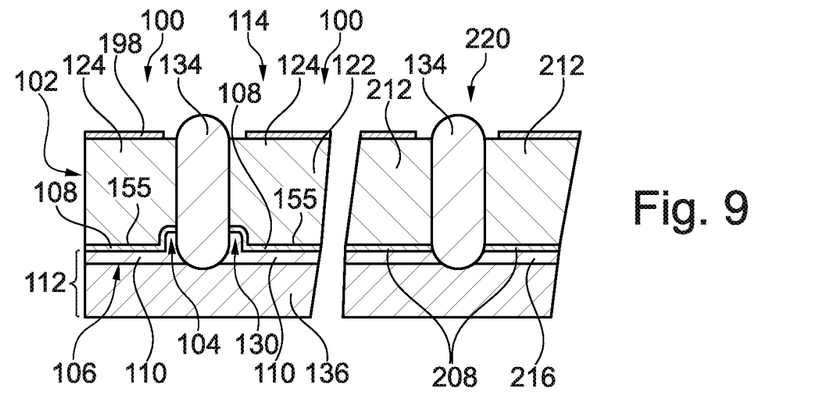

Referring to the left-hand side of FIG. 9, electronic chips 100 are separated from the wafer 102 by mechanically cutting using a mechanical blade 134 (or knife). More specifically, the electronic chips 100 are separated from the wafer 102 by guiding the mechanical blade 134 through the entire wafer 102, through an entire adhesive layer 110 of the tape 112, and partially into a foil 136 of the tape 112 below the adhesive layer 110. By advancing into the foil 136 of the tape 112, a complete separation of the electronic chips 100 may be guaranteed.

Preferably, at least part of each of the trenches 104, 130 is filled above a baseline level 155—which may be defined as a horizontal level corresponding to an interface between back side metallization 108 and wafer 102 outside of the trenches 104, 130—with adhesive of the adhesive layer 110 of the tape 112 during formation of the separation path 116 which separates a respective electronic chip 100 from the wafer 102. Advantageously, separating the electronic chip 100 is carried out in such a way that the adhesive layer 110 fills the entire trenches 104, 130 during separating. Hence, according to FIG. 9, the tape 112 is mounted on the back side 106 to completely fill the dimples or trenches 104, 130 within adhesive material of the adhesive layer 110 (such as glue). Thereafter, the supporting carrier 150 may be removed. Further subsequently, the wafer 102 is singularized by dicing (for instance mechanically or laser) into the individual electronic chips 100, by cutting along separation path 116.

A corresponding process is carried out on the right hand side of FIG. 9, compare reference sign 220. However, no trenches 104, 130 are present.

Figure 10:
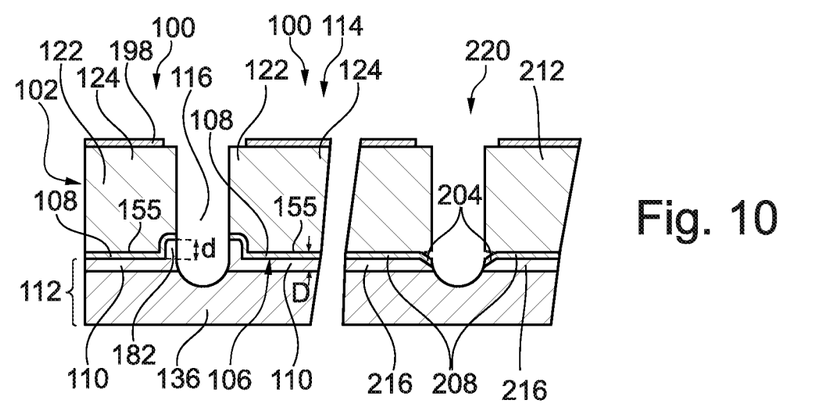

As shown in FIG. 10, the mechanical blade 134 may then be removed.

Figure 11:
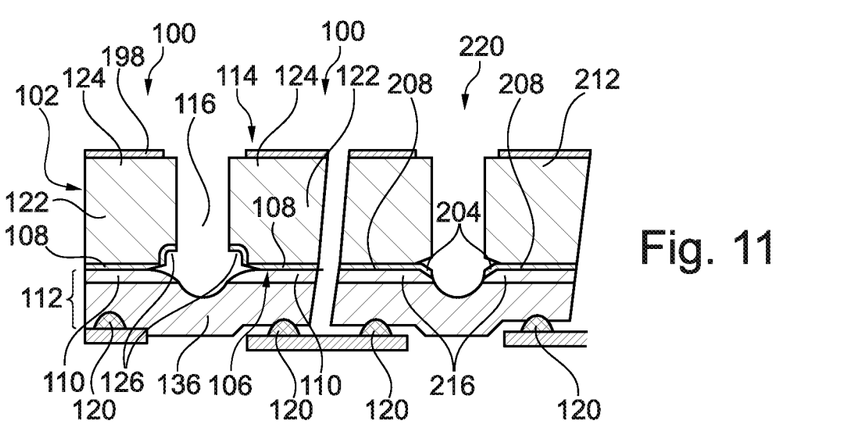

Referring to the left side of FIG. 10 and FIG. 11, the singularized die-type electronic chip 100 may be lifted with ejection pins 120 during a pick-up process. Advantageously, no edge clamping occurs thanks to the upwardly bent lateral ends of the back side metallization 108 of a respective chip 100. A full release of the electronic chip 100 from the tape 112 is enabled with low pick-up force. Due to the filling of the trenches 104, 130 with adhesive material of the adhesive layer 110 of the tape 112 also above a baseline level 155 of the back side metallization 108 during singularization (see also reference sign 182), the adhesive supports the back side metallization 108 against cracks and thereby ensures mechanical integrity of the separated electronic chip 100.

As shown on the right hand side of FIG. 10 and FIG. 11 and referring to a reference sign 220, a harder release of the chip edge from the tape 210 occurs without the extra implant of dopant 128 and without formation of the trenches 104, 130. Downwardly (rather than upwardly) bent burrs 204 of the back side metallization 208 keep the chip edges strongly adhered to the tape 210 and thereby result in an undesirably high pick-up force involving a high risk of damage to the tiny electronic chip 212.

Referring again to the left-hand side of FIG. 11, the pick-up process works smoothly and with low force, as described above referring to FIG. 5.

Referring again to the right hand side of FIG. 11, a harder release of the electronic chip 212 from the tape 210 occurs without extra implant.

Figure 12:
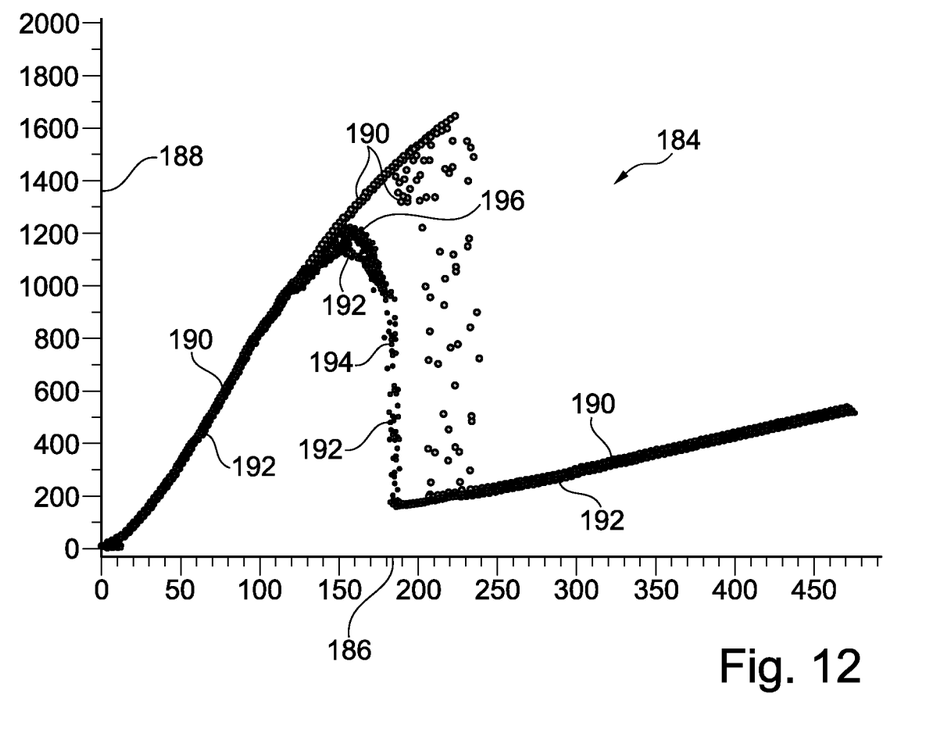
FIG. 12 is a diagram showing experimental results of a pin distance to lifting force relation according to an exemplary embodiment and in a conventional approach.

FIG. 12 is a diagram 184 showing experimental results of a pin distance to lifting force relation according to an exemplary embodiment and in a conventional approach. More specifically, a pin or needle height is plotted (in micrometers) along an abscissa 186. Along an ordinate 188, a pick-up force is plotted (in cN). Descriptively speaking, advancing along the abscissa 186 towards the right-hand side corresponds to rising of the ejection pin or needle, which increases the force. A first curve 190 relates to a conventional scenario with edge clamping. A second curve 192 relates to a scenario of an exemplary embodiment without edge clamping of a separated electronic component 100 during pick-up. Diagram 184 is obtained by executing a pick up force measurement.

Comparing curves 190, 192 shows that curve 192 indicates a smoother and softer detachment of an electronic chip edge from a tape. At a position 194, the electronic chip 100 is detached from the tape 112. As indicated by reference sign 196, the pick-up force of an exemplary embodiment is significantly smaller than in the comparative conventional approach according to curve 190. In the conventional approach according to curve 190, the electronic chip is detached from the tape in a discontinuous way with a high mechanical load, which may trigger an undesired oscillation or even a crack of the electronic chip. In contrast to this, the exemplary embodiment allows pick-up of the electronic chip from the tape with less force and in a more continuous manner.

Figure 13:
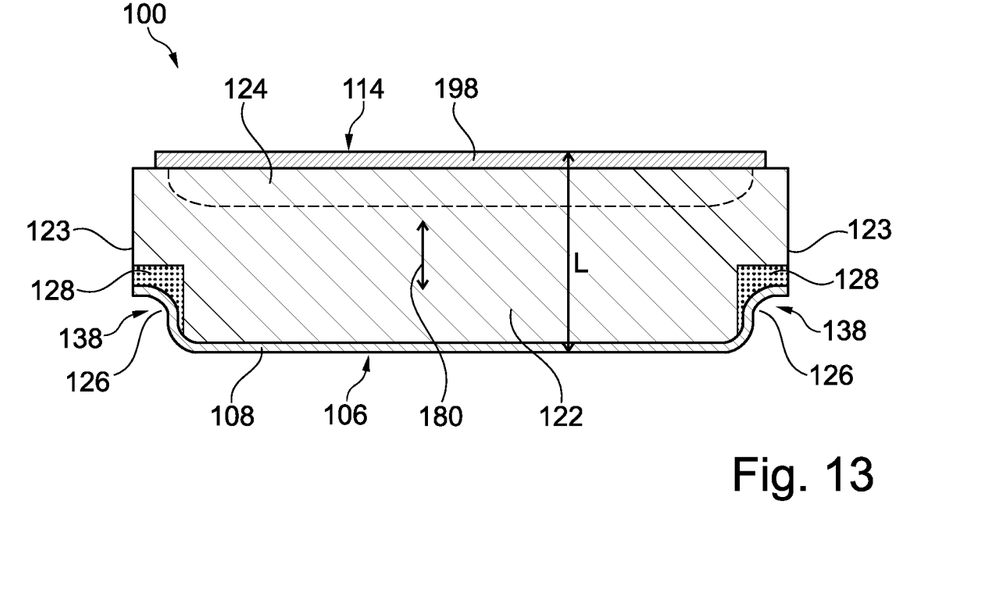
FIG. 13 shows a cross sectional view of an electronic chip manufactured according to an exemplary embodiment.

FIG. 13 shows a cross sectional view of an electronic chip 100 manufactured according to an exemplary embodiment. For instance, the electronic chip 100 may be a MOSFET (metal oxide semiconductor field effect transistor) chip, an IGBT (insulated gate bipolar transistor) chip, and/may have a monolithically integrated diode. During operation, the electronic chip 100 may experience a vertical current flow, as indicated schematically in FIG. 13 with reference sign 180. The thickness L of the electronic chip 100 may be extremely small, for instance may be less than 60 µm.

The illustrated electronic chip 100 is configured as a semiconductor power chip and comprises a semiconductor body 122, such as a piece of silicon. An active region 124 at a front side 114 of the semiconductor body 122 is processed by integrated circuit technology so that for instance constituents of a field effect transistor are monolithically integrated in the active region 124 on the front side 114. Moreover, a front side metallization 198 is formed on the active region 124. Furthermore, a back side metallization 108 is formed at a back side 106 of the semiconductor body 122 which opposes the front side 114. When the electronic chip 100 experiences a vertical current flow between the front side 114 and the back side 106 during operation, current flows along a direction according to reference sign 180 between the front side metallization 198 and the back side metallization 108.

As a fingerprint of the manufacturing method of manufacturing electronic chip 100 according to FIG. 13 in accordance with one of the embodiments described referring to FIG. 1 to FIG. 11, a circumferential notch 126 is formed at a circumferential corner 138 of the semiconductor body 122 between the back side 106 (i.e. the bottom main surface of the electronic chip 100) and sidewalls 123 of the semiconductor body 122. The circumferential notch 126 corresponds to a portion of a former trench 104, 130 formed for reducing a pick-up force after singularization of the electronic chip 102 from a wafer compound, as described above. Furthermore, dopant 128 (for instance implanted boron atoms) is present selectively in a region of the semiconductor body 122 next to the circumferential notch 126.

As a result of the selective etching process carried out for creating a respective trench 104, 130, the circumferential notch 126 may be rounded at the back side 106. Moreover, the circumferential notch 126 may be delimited by a continuously curved surface portion of the semiconductor body 122, which is also the consequence of the previous creation of a respective trench 104, 130. For instance, a concentration of the dopant 128 is at least $10^{17}$ atoms per $cm^3$, and may be at least 1000 times of a natural impurity in the semiconductor body 122. In particular, a dopant concentration along the entire circumference of the notch 126 at the back side 106 of the semiconductor body 122 may be significantly larger than in a central portion at the back side 106 of the semiconductor body 122. The presence of the dopant 128 results from the fact that the respective trench 104, 130 has been selectively etched in the semiconductor body 122 with a remarkably increased etching rate in doped semiconductor material in comparison to non-doped semiconductor material.

Figure 14:
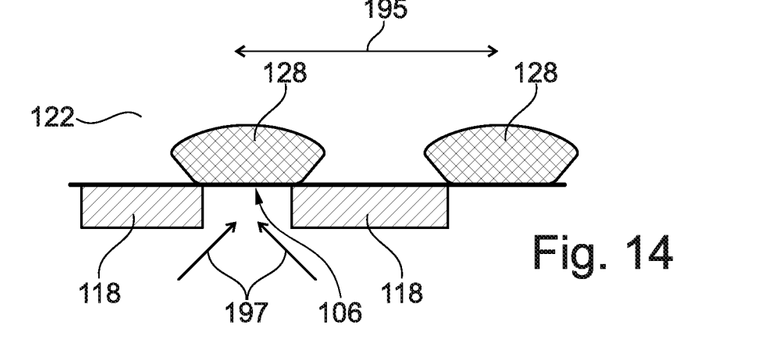
FIG. 14 to FIG. 16 show different structures obtained during carrying out a method of separating and picking an electronic chip from a wafer according to an exemplary embodiment.
Figure 15:
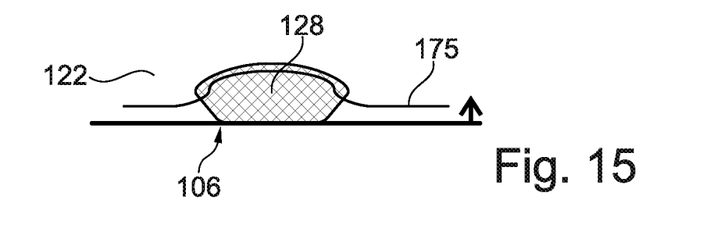
Figure 16:
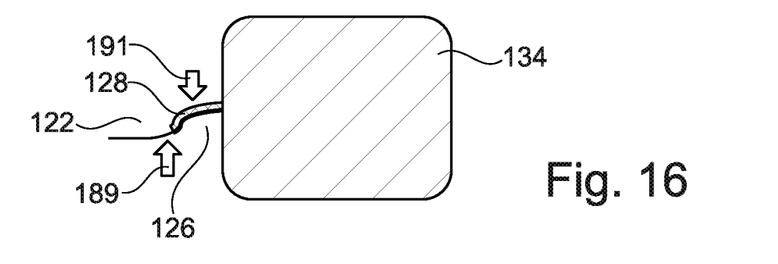

FIG. 14 to FIG. 16 show different structures obtained during carrying out a method of separating and picking an electronic chip 100 from a wafer 102 according to an exemplary embodiment.

Referring to FIG. 14, a cross-section through a dicing channel edge at the chip back side is illustrated. More specifically, reference sign 197 illustrates implantation of a dopant 128 by a quad mode implant process. By such a slanted implantation of dopant 128, the illustrated doping profile may be obtained, A later dicing channel is indicated with reference sign 195 in FIG. 14.

FIG. 15 illustrates an etching profile 175 obtained by wet etching the back side 106 of the semiconductor body 122. Hence, a final back side geometry after wet etching is shown. This geometry can be obtained due to a higher etching rate in doped silicon as compared to non-doped silicon, for instance when using HNA as wet etchant.

FIG. 16 shows a geometry of change when dicing the semiconductor body 122 using a dicing blade 134 in the dicing channel. As shown with reference sign 191, a certain implant dose or dopant 128 remains at the circumferential notch 126 in the readily manufactured electronic chip 100. Referring to reference sign 189, the characteristic shape of the wet edge surface is illustrated.

Figure 17:
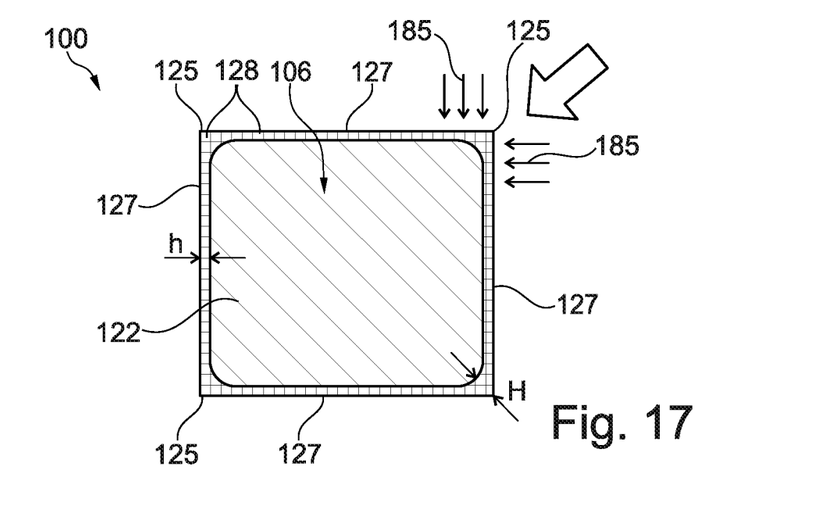
FIG. 17 shows a plan view of an electronic chip manufactured according to an exemplary embodiment.

FIG. 17 shows a plan view of a bottom side of an electronic chip 100 manufactured according to an exemplary embodiment.

As shown in FIG. 17, the dopant concentration along the entire circumference of the notch 126 at the back side 106 of the semiconductor body 122 is larger than in a central portion at the back side 106 of the semiconductor body 122. More specifically, a dimension "H" along which dopant 128 extends into the semiconductor body 122 at each corner of the electronic chip 100 is larger than a dimension "h" along with dopant 128 extends into the semiconductor body 122 at each edge of the electronic chip 100. As shown, the dopant 128 is present only in a circumferential region of the semiconductor body 122 next to the circumferential notch 126. In particular, the dopant 128 extends deeper (i.e. by dimension "H") into an interior of the semiconductor body 122 in corners 125 than in edges 127 (corresponding to dimension "h", wherein h<H) of the semiconductor body 122 at the back side 106. This is the result of an implanting geometry illustrated in FIG. 17 with reference sign 185. Hence, a corner rounding results due to a higher implant dose at chip corners in a quad mode implanting process.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of separating an electronic chip from a wafer, wherein the method comprises:
    forming two spaced trenches in a back side of the wafer around at least part of the electronic chip to be separated;
    forming a back side metallization covering at least part of the back side and at least part of the at least one trench;
    attaching an adhesive layer of a tape to at least part of the back side metallization; and
    separating the electronic chip by removing material from a front side of the wafer along a separation path which includes part of each of the two spaced trenches in such a way that, during separating, the adhesive layer fills at least part of the two spaced trenches above a level of the back side metallization on the back side to support the back side metallization along the separation path during the separating of the electronic chip.

2. The method according to claim 1, wherein the method comprises forming the two spaced trenches parallel to each other and/or around a common center.

3. The method according to claim 1, wherein the method comprises separating the electronic chip along the separation path which includes a region extending between the two spaced trenches.

4. The method according to claim 1, wherein the method comprises forming the two spaced trenches circumferentially closed around the entire electronic chip to be separated.

5. The method according to claim 1, wherein the method comprises forming the two spaced trenches with a depth being smaller than or equal to a thickness of the adhesive layer.

6. The method according to claim 1, wherein the method comprises forming the two spaced trenches with a depth in a range from 3 µm to 10 µm.

7. The method according to claim 1, wherein the method comprises forming each of the two spaced trenches with a width smaller than a width of the separation path.

8. The method according to claim 1, wherein the method comprises separating the electronic chip by one of the group consisting of cutting with a mechanical blade, and laser processing.

9. The method according to claim 8, wherein the method comprises separating the electronic chip by guiding the mechanical blade through the entire wafer, through the entire adhesive layer, and into a foil of the tape below the adhesive layer.

10. The method according to claim 1, wherein the method comprises separating the electronic chip in such a way that the adhesive layer fills the entire two spaced trenches during separating.

11. The method according to claim 1, wherein the method comprises forming the two spaced trenches by covering the back side of the wafer with a patterned mask, and by etching the wafer through the patterned mask.

12. The method according to claim 1, wherein the method comprises picking the separated electronic chip from the tape after the separating.

13. The method according to claim 12, wherein picking the separated electronic chip comprises lifting the electronic chip from the tape by at least one pin applying a lifting force to the back side of the electronic chip.

14. The method according to claim 12, wherein picking the separated electronic chip comprises sucking the lifted electronic chip at the front side of the electronic chip.

15. The method according to claim 1, wherein the electronic chip has a thickness of less than 60 µm.

16. The method according to claim 1, wherein the electronic chip is configured for experiencing a vertical current flow between the front side and the back side during operation.

17. A method of separating an electronic chip from a wafer, wherein the method comprises:
    forming two spaced trenches in a back side of the wafer around at least part of the electronic chip to be separated;
    forming a back side metallization covering at least part of the back side and at least part of the at least one trench;
    attaching an adhesive layer of a tape to at least part of the back side metallization;
    separating the electronic chip by removing material from a front side of the wafer along a separation path which includes part of each of the two spaced trenches in such a way that, during separating, the adhesive layer fills at least part of the two spaced trenches above a level of the back side metallization on the back side to support the back side; and wherein the method comprises forming the two spaced trenches by covering the back side of the wafer with a patterned mask, by doping the wafer through the patterned mask, and by etching the wafer after removing the patterned mask.

\* \* \* \* \*